United States Patent [19]

Sutcliffe

[11] Patent Number: 4,519,732
[45] Date of Patent: May 28, 1985

[54] METHOD FOR THE MACHINING OF COMPOSITE MATERIALS

[75] Inventor: John W. Sutcliffe, Tolland, Conn.

[73] Assignee: United Technologies Corporation, Hartford, Conn.

[21] Appl. No.: 559,996

[22] Filed: Dec. 9, 1983

[51] Int. Cl.³ .................. B23B 51/06; B23B 35/00
[52] U.S. Cl. .................... 408/1 R; 408/56; 408/61; 407/11; 82/1 C; 82/DIG. 1; 264/155
[58] Field of Search .............. 408/56, 61, 57, 1 R, 408/59, 60, 58; 409/131, 135; 407/11; 82/1 C, DIG. 1; 264/155

[56] References Cited

U.S. PATENT DOCUMENTS 1,385,732  7/1921  Taylor .
2,478,846  8/1949  Smith ............................ 125/20
2,491,635  12/1949 Allen, Jr. ......................... 77/55
2,638,084  5/1953  McLaughlin ................... 125/20
3,141,378  7/1964  Rabinow ......................... 90/11
3,518,917  6/1970  Slunam ........................... 90/11
3,618,461  11/1971 Parker ............................. 90/11
3,739,461  6/1973  Cupler, II ....................... 29/557
4,076,442  2/1978  Cox, Jr. et al. ................. 408/8

Primary Examiner—Gil Weidenfeld
Assistant Examiner—Daniel W. Howell
Attorney, Agent, or Firm—John Swiatocha

[57] ABSTRACT

In the machining of composite material, improved rates of material removal and reduced machine tool wear are achieved by a cutting fluid comprising the binder of said composite in an uncured state.

5 Claims, 1 Drawing Figure

U.S. Patent   May 28, 1985   4,519,732
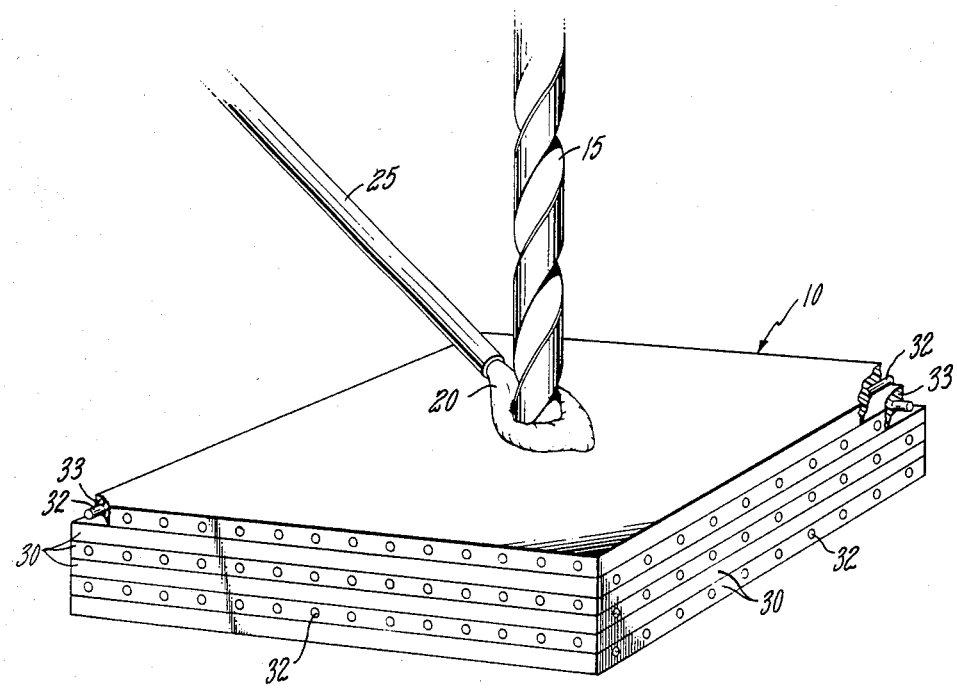

METHOD FOR THE MACHINING OF COMPOSITE MATERIALS

TECHNICAL FIELD

This invention relates to an improved method for machining composite materials.

BACKGROUND ART

Composite materials are becoming increasingly popular in applications where high strength, low weight materials are required. By way of example, composites have found wide acceptance in the aerospace industry for airplane propeller and helicopter rotor blades as well as structural components of airframes. Composites are also employed as the primary structural material in the blades of modern, large wind turbines.

Generally, composite components are manufactured by laying up multiple sheets of the composite material in a laminar arrangement, the lay-up then being cured or hardened. As those skilled in the art will appreciate, subsequent to curing, drilling and/or reaming of holes in the material as well as other machining of the material may be required. Such machining operations are often costly and time consuming due to rapid tool wear. While in the machining of metals, tool wear is minimized by the utilization of cutting fluids such as any of various known cutting oils, such fluids can attack the composite laminate thereby adversely affecting the structural integrity of the composite article and are therefore generally unsuitable for use in the machining of composites.

DISCLOSURE OF INVENTION

It is therefore among the objects of the present invention to provide an improved method for the machining of composite materials with reduced tool wear.

It is another object of the present invention to provide an improved cutting fluid for use in the machining of cured, composite articles.

These and other objects which will be more readily apparent from the following detailed description taken in connection with the appended claims and accompanying drawing, are achieved by the present invention wherein tool wear is reduced and the speed of machining of composite material is enhanced by utilizing a cutting fluid comprising the same binder as is used in the composite, only in an uncured state. Thus, in the drilling, reaming or other machining of composite materials comprising fiberglass strands disposed in a matrix of epoxy binder, uncured epoxy is employed as a cutting fluid. Similarly, where polyesters or polyimides are employed as matrix materials, in accordance with the present invention, those materials in uncured states thereof are used as cutting fluids to reduce tool wear and enhance the speed at which the material may be machined.

BRIEF DESCRIPTION OF DRAWING

The FIGURE of the drawing is a schematic representation of the method of the present invention.

BEST MODE FOR CARRYING OUT THE INVENTION AND INDUSTRIAL APPLICABILITY THEREOF

Referring to the drawing, a composite laminate 10 is shown being drilled by a drill 15 while a cutting fluid 20 is discharged from pipe 25 to the point of contact of the drill and the composite material.

Composite material 10 comprises a plurality of laminations or layers 30 each comprising a distribution of fibers 32 of any suitable material such as any of the various known glasses, graphite, or silicon carbide, distributed within a matrix 33 of cured epoxy or any of various known polyesters or polyimides. While the fibers of each layer is shown as being angularly offset by approximately 90° from the fibers of an adjacent layer, the present invention is not limited to such an arrangement.

As set forth hereinabove, known cutting fluids in common use for the machining of metals are generally not suitable for use in the drilling or machining of composites in that such cutting fluids react adversely with the composite material. Accordingly, heretofore, it has been the practice to drill or machine composite material in a dry state with an attendant high rate of machine tool wear and low rate of material removal. In accordance with the present invention, a cutting fluid comprising the material used as the binder of composite 10, only in an uncured state, is applied to the point of contact of drill 15 with the composite. Thus, where the binder in composite 10 comprises a cured epoxy resin, cutting fluid 20 comprises such a resin in an uncured state. Likewise, where the binder comprises a polyester or polyimide, fluid 20 comprises such a material in an uncured state.

It has been found that the use of uncured binder material as a cutting fluid involves no adverse reaction between the fluid and the composite being machined. In tests, utilization of an uncured epoxy resin as a cutting fluid in the hand reaming of fiber-glass-epoxy composites shortened the time required to ream the necessary holes by a factor of 10 while decreasing the frequency at which the reamers required sharpening by 300%.

While a particular embodiment of the present invention has been described, it will be appreciated that the various modifications of the present invention will be suggested to those skilled in the art by the disclosure herein. Thus, while the invention has been described in the environment of composite drilling, it will be understood that the invention herein is useful in any composite machining operation. Similarly, while specific fibers and matrix materials have been named, the present invention is useful with any known synthetic matrix material which exists as a fluid in an uncured state. Accordingly, it is the intention of the following claims to cover all such modifications as fall within the true spirit and scope of this invention.

Having thus described the invention, what is claimed is:

1. In a process of machining a composite by a machine tool, said composite comprising a disposition of fibrous material within a matrix of cured binder material, the improvement characterized by:
    lubricating said machine tool with a fluid comprising said binder material in an uncured state for reducing tool wear and enhancing the rate of removal of said composite material by said tool.
2. The process of claim 1 characterized by said process comprising the reaming of said composite material and said machine tool comprising a reamer.
3. The process of claim 1 characterized by said binder material comprising an epoxy resin.
4. The process of claim 1 characterized by said binder material comprising a polyester resin.
5. The process of claim 1 characterized by said binder material comprising a polyimide resin.

* * * * *